United States Patent
Hori

(10) Patent No.: US 8,212,618 B2
(45) Date of Patent: Jul. 3, 2012

(54) VARIABLE GAIN AMPLIFIER

(75) Inventor: Shinichi Hori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/920,149

(22) PCT Filed: Feb. 26, 2009

(86) PCT No.: PCT/JP2009/053544
§ 371 (c)(1),
(2), (4) Date: Aug. 30, 2010

(87) PCT Pub. No.: WO2009/110370
PCT Pub. Date: Sep. 11, 2009

(65) Prior Publication Data
US 2011/0001564 A1    Jan. 6, 2011

(30) Foreign Application Priority Data
Mar. 4, 2008    (JP) .................................. 2008-053407

(51) Int. Cl.
*H03G 3/30* (2006.01)
(52) U.S. Cl. ......................................... 330/284; 330/51
(58) Field of Classification Search .................. 330/284, 330/51, 9, 295, 84, 124 R
See application file for complete search history.

(56) References Cited

U.S. PATENT DOCUMENTS
7,038,545 B2 * 5/2006 Behzad et al. ................ 330/284

FOREIGN PATENT DOCUMENTS
JP    2001044776 A    2/2001
JP    2006311623 A    11/2006

OTHER PUBLICATIONS

International Search Report for PCT/JP/053544 mailed May 26, 2009.
P. Quinlan et al., "A Multimode 0.3-200-kb/s Transceiver for the 433/868/915-MHz Bands in 0.25-μm CMOS", IEEE Journal of Solid-State Circuits, vol. 39, No. 12, Dec. 2004, pp. 2297-2310.

* cited by examiner

*Primary Examiner* — Hieu Nguyen

(57) ABSTRACT

A variable gain amplifier which includes a plurality of individual amplifiers and variably controls the gain by switching to and using one of the individual amplifier circuits includes an individual amplifier (11) which amplifies a signal input from the input terminal of the variable gain amplifier (100) by an active element (M1), and outputs the input signal, an attenuator (14) which attenuates the input signal by a passive circuit (ZC), and outputs the input signal as an attenuated signal, and a virtual ground point providing circuit (15) which provides a virtual ground potential to the input terminal of the virtual ground point providing circuit (15) by an isolation active circuit (MC) interposed between the input terminal of the virtual ground point providing circuit (15) and the ground node of the variable gain amplifier (100).

9 Claims, 9 Drawing Sheets

VARIABLE GAIN AMPLIFIER

The present application is the National Phase of PCT/JP2009/053544, filed Feb. 26, 2009, which claims priority based on Japanese patent application No. 2008-053407 filed on Mar. 4, 2008, both of which are still pending.

TECHNICAL FIELD

The present invention relates to an amplifier and, more particularly, to a variable gain amplifier capable of variably controlling the amplification gain.

BACKGROUND ART

In general, a radio receiver is assumed to receive radio waves having various strengths depending on the environment. For example, the strength of a received radio wave is high if the distance to a terminal or base station serving as a communication partner is short, and decreases as the distance becomes longer.

To cope with this situation, the input portion of the radio receiver generally requires a variable gain amplifier which adjusts a radio signal received by the antenna to an optimum power level and transmits it to the next stage.

The variable gain amplifier generally determines an amplification factor to maximize the ratio of signal power to noise and distortion generated in the amplifier (to be referred to as an SNDR (Signal-to-Noise and Distortion Ratio). The SNDR is given by

[Mathematical 1]

$$SNDR = \frac{S_{in}}{N_{in} + \frac{N_{add} + N_{dist}}{G}} \quad (1)$$

where $S_{in}$ is the input signal power, G is the amplification factor of the variable gain amplifier, $N_{in}$ is the input noise power, $N_{add}$ is the noise generated in the amplifier, and $N_{dist}$ is the distortion generated in the amplifier.

Generally, the distortion generation amount depends on the magnitude of signal power in the circuit, and increases in proportion to the power of 2 or more of the magnitude of signal power. In contrast, the magnitude of noise is independent of that of signal power.

When an input signal is small and the distortion generation amount is much smaller than thermal noise, equation (1) is approximated as

[Mathematical 2]

$$SNDR = \frac{S_{in}}{N_{in} + \frac{N_{add}}{G}} \quad (2)$$

From equation (2), the SNDR can be increased by setting a high amplification factor G.

When an input signal voltage is large and the distortion generation amount is much larger than noise, equation (1) is approximated as

[Mathematical 3]

$$SNDR = \frac{S_{in}}{N_{in} + \frac{N_{dist}}{G}} \quad (3)$$

As described above, the distortion $N_{dist}$ of the amplifier is proportional to the power of 2 or more of the amplification factor G. Considering this, the SNDR can be increased by setting a low amplification factor G.

From this, the variable gain amplifier adjusts the amplification factor to be high for small input signal power, and low for large signal power. The variable gain amplifier can, therefore, transmit a signal to the next stage while keeping the SNDR high in a wide range (dynamic range) of the input signal power strength. Especially in a variable gain amplifier for a high frequency band of several hundred MHz or more, it is a common practice to widen the dynamic range by switching between a plurality of amplifiers having different amplification factors.

The first arrangement example concerning such a variable gain amplifier will be explained (see, e.g., Philip Quinlan, Patrick Crowley, Miguel Chanca, Sean Hudson, Bill Hunt, Kenneth Mulvaney, Guido Retz, Cormac E. O'Sullivan and Patrick Walsh, "A Multimode 0.3-200-kb/s Transceiver for the 433/868/915-MHz Bands in 0.25-μm CMOS", IEEE J. Solid-State Circuits, vol. 39, pp. 2297-2310, December 2004). FIG. 14 shows the first arrangement example concerning a variable gain amplifier. In a variable gain amplifier 200 in this arrangement example, two amplifiers 41 and 42 which have active elements at their input portions and are different in gain are juxtaposed. The amplification factor of the amplifier 41 is higher than that of the amplifier 42. The output terminals of the amplifiers 41 and 42 are connected to a selector 43. The selector 43 selects either of outputs from the two amplifiers 41 and 42 so as to increase the SNDR of the amplifier, and transmits the signal to the next stage.

In an actual radio receiver, the selector 43 selects the amplifier 41 when the voltage amplitude of an input signal is small and the distortion generation amount is smaller than the thermal noise generation amount, and it selects the amplifier 42 in an opposite case.

In this arrangement example, the active element is arranged at the input portion in order to increase the maximum gain of the variable gain amplifier. As represented by equation (2), when the signal voltage is small, the SNDR becomes higher for a larger gain. That is, increasing the maximum gain means further decreasing the lower limit of the dynamic range to widen the dynamic range.

The second arrangement example concerning a variable gain amplifier will be explained (see, e.g., Japanese Patent Laid-Open No. 2006-311623). FIG. 15 shows the second arrangement example concerning a variable gain amplifier. In a variable gain amplifier 210 in this arrangement example, an amplifier 51 for amplifying an input signal, and an amplifier 52, at the input stage of which an attenuator 54 is arranged, are juxtaposed. The amplifiers 51 and 52 are equal in gain and have active elements at their input portions. The amplifiers 51 and 52 are connected to a control circuit 53. By operating either the amplifier 51 or 52, the control circuit 53 can extract only an output from one amplifier.

In this arrangement example, when the control circuit 53 selects the amplifier 51, the gain of the variable gain amplifier 210 is directly indicated by that of the amplifier 51. When the control circuit 53 selects an output from the amplifier 52, the gain of the variable gain amplifier 210 is represented by a value obtained by dividing the gain of the amplifier 52 by the attenuation factor of the attenuator 54. Similar to the first arrangement example, the second arrangement example can change the gain in two steps by switching the operation states of the amplifiers 51 and 52 by the control circuit 53.

DISCLOSURE OF INVENTION

Problems to be Solved by the Invention

However, these related arts suffer the problem of a narrow dynamic range if the power supply voltage of the variable gain amplifier drops.

The radio receiver needs to reduce power consumption for a long battery life. Thus, the power supply voltage is also being reduced along with the reduction of power consumption. However, the specification of the maximum value of the input signal voltage requested of the radio receiver is determined by each radio standard and does not change. As the power supply voltage decreases, the variable gain amplifier arranged at the initial stage of the radio receiver may receive a signal larger in amplitude than the power supply voltage.

In the first arrangement example, in a situation in which a signal larger in amplitude than the power supply voltage is input, an output from the amplifier 42 is selected as the output to minimize the distortion generation amount in order to decrease the gain. However, since the input portion of the amplifier 42 is formed from an active element, a large distortion is generated at the input portion in this situation, greatly decreasing the SNDR.

In the second arrangement example, an output from the amplifier 52 is selected in the above situation to minimize the distortion generation amount, similar to the first arrangement example. A signal voltage input to the amplifier 52 can be adjusted to a satisfactorily small value by setting the attenuation amount of the attenuator 54 at the input stage of the amplifier 52 to an appropriate value. Even if a signal voltage input to this conventional arrangement is larger than the power supply voltage, the distortion generated by the amplifier 52 can be suppressed sufficiently small, minimizing the decrease in SNDR. The attenuator 54 is formed from a passive element having a very high linearity, compared to an active element, so almost no distortion is generated in the attenuator 54.

However, in the second arrangement example, the distortion generated in the amplifier 51 not selected as the output leaks to the signal path of the attenuator 54 via the ground terminal of the variable gain amplifier 210, greatly decreasing the SNDR.

In general, a ground point inside an integrated circuit (IC) which forms the radio receiver is connected via a bonding wire to an external ground point having an ideal ground characteristic. The bonding wire normally has a several nH-inductor component. Hence, it becomes more difficult for the ground node inside the IC (to be referred to as an IC ground node) to maintain the ideal ground characteristic in a higher-frequency region.

Under these circumstances, noise and distortion generated at all portions within the receiver are mixed in the signal path via the IC ground node in a radio receiver which handles radio signals of several hundred MHz or more. However, when a signal voltage input to the radio receiver is equal to or smaller than the power supply voltage, the noise/distortion generation amount is not so large. Even if noise or distortion is mixed in the signal path, the SNDR does not decrease seriously.

To the contrary, if a signal voltage input to the radio receiver increases to exceed the power supply voltage and is directly input to the active element without attenuation, the distortion generation amount increases greatly.

At this time, in the second arrangement example, the active element at the input portion of the amplifier 51 is directly connected to the input terminal. A large signal voltage input from the input terminal generates a large distortion at the active element.

A signal voltage input to the amplifier 52 is greatly attenuated by the attenuator 54 at the input stage. If the distortion leaks to the input portion of the amplifier 52 without attenuation, the SNDR decreases greatly. Particularly in the second arrangement example, the attenuator 54 is formed from only a passive element, so the isolation between the ground terminal and the signal path is poor. For this reason, the distortion leaks to the input portion of the amplifier 52 via the ground terminal of the attenuator 54 without sufficient attenuation, seriously decreasing the SNDR.

As described above, in either arrangement example, when a signal larger in amplitude than the power supply voltage is input, the SNDR decreases greatly. Decreasing the upper limit narrows the entire dynamic range.

Note that the dynamic range cannot be kept wide if an active element is not directly connected to the input terminal of the variable gain amplifier in order to avoid the decrease in SNDR. This is because in the arrangement in which an active element is not directly connected, the maximum gain of the variable gain amplifier becomes small and the SNDR decreases at a low signal voltage, as represented by equation (2). That is, the lower limit of the dynamic range rises, narrowing the dynamic range.

The present invention has been made to solve the above problems, and has as its exemplary object to provide a variable gain amplifier capable of maintaining a high SNDR and outputting a signal even after receiving a signal larger in voltage amplitude than the power supply voltage.

Means of Solution to the Problems

To achieve the above object, according to the present invention, a variable gain amplifier which includes a plurality of individual amplifiers and variably controls a gain by switching to and using one of the individual amplifier circuits comprises an individual amplifier which amplifies a signal input from an input terminal of the variable gain amplifier by an active element, and outputs the input signal, an attenuator which attenuates the input signal by a passive circuit, and outputs the input signal as an attenuated signal, and a virtual ground point providing circuit which includes an isolation active circuit interposed between an input terminal of the virtual ground point providing circuit and a ground node of the variable gain amplifier, and provides, by the isolation active circuit, a virtual ground potential to the passive circuit of the attenuator that is connected to the input terminal of the virtual ground point providing circuit.

EFFECTS OF THE INVENTION

The present invention can maintain a high isolation between the signal path of the attenuator and the ground node of the variable gain amplifier, compared to an arrangement in which the ground terminal of the attenuator is directly connected to the ground node of the variable gain amplifier. Therefore, the present invention can decrease the amount by which the distortion and noise generated in a circuit block other than the attenuator are mixed in the signal line of the attenuator via the ground node of the variable gain amplifier.

Even if a signal voltage larger than the power supply voltage is input, the SNDR can be kept high. A wide dynamic range can be implemented even at low power supply voltage, avoiding a serious decrease in SNDR.

BEST MODE FOR CARRYING OUT THE INVENTION

Exemplary embodiments of the present invention will now be described with reference to the accompanying drawings.

[Basic Arrangement of Invention]

Figure 1:
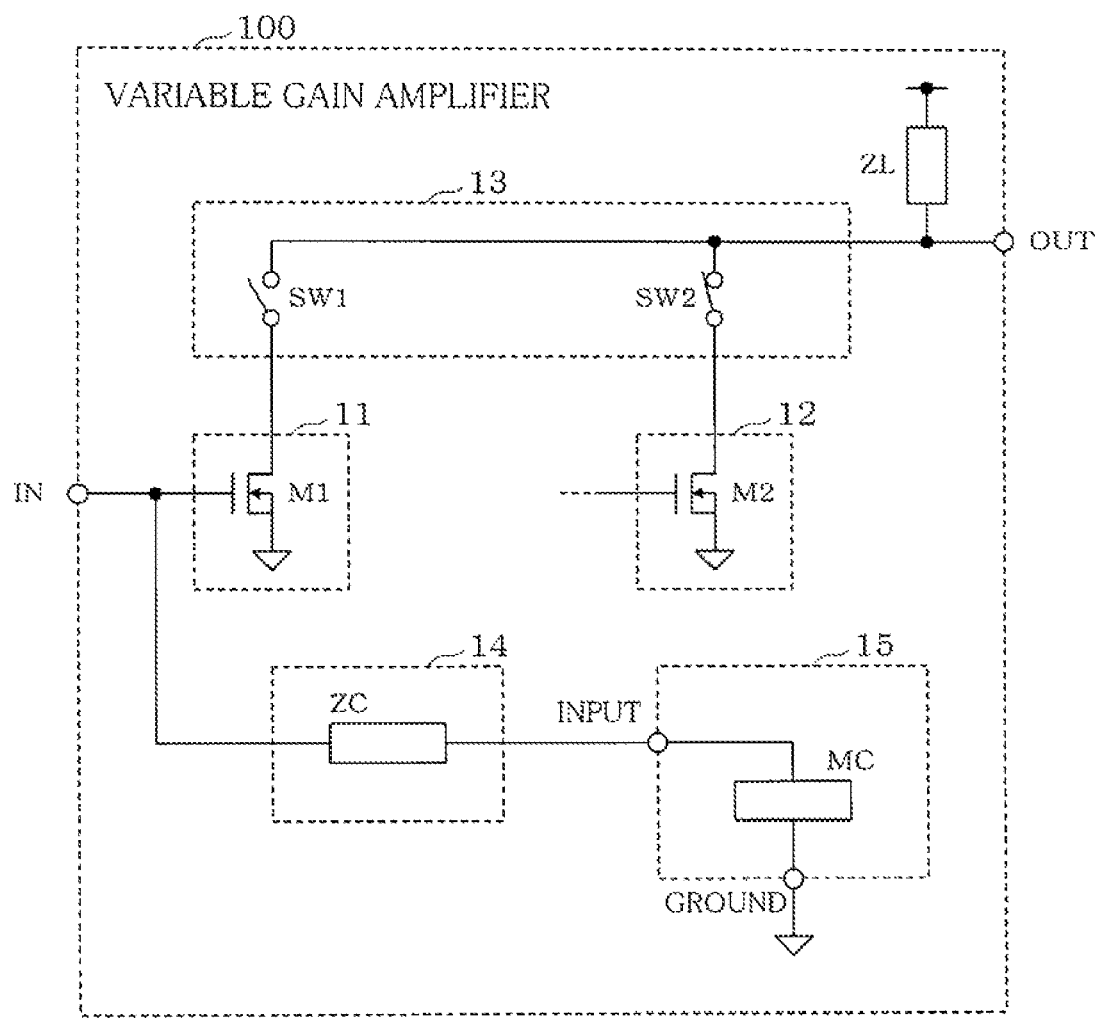
FIG. 1 is a circuit diagram showing the basic arrangement of a variable gain amplifier according to the present invention.

The basic arrangement of a variable gain amplifier 100 according to the present invention will be explained with reference to FIG. 1. FIG. 1 is a circuit diagram showing the basic arrangement of the variable gain amplifier according to the present invention.

The variable gain amplifier 100 includes a plurality of individual amplifiers, and has a function of variably controlling the gain by switching to one of the individual amplifiers by a switch and using it. The variable gain amplifier 100 includes, as main components, an individual amplifier (first individual amplifier) 11, switch 13, attenuator 14, and virtual ground point providing circuit 15. A case in which these components are formed as integrated circuits on a single semiconductor substrate will be exemplified.

The individual amplifier 11 includes an active element M1 having a control terminal connected to the input terminal IN of the variable gain amplifier 100. The individual amplifier 11 has a function of amplifying a signal input from the input terminal IN by the active element M1 (first active element) and outputting the amplified signal.

An individual amplifier 12 is one of the individual amplifiers, similar to the individual amplifier 11. The individual amplifier 12 has a function of amplifying a signal input from the input terminal IN with a gain different from that of the individual amplifier 11, and outputting the amplified signal.

The switch 13 has a function of switching to either of outputs from the individual amplifiers 11 and 12, and supplying it to the output terminal OUT of the variable gain amplifier 100.

The attenuator 14 has a function of attenuating a signal input from the input terminal IN by a passive circuit ZC and outputting it as an attenuated signal.

The virtual ground point providing circuit 15 includes an isolation active circuit MC which is interposed between the input terminal of the virtual ground point providing circuit 15 and the ground node of the variable gain amplifier 100. The virtual ground point providing circuit 15 has a function of providing a virtual ground potential by the isolation active circuit MC to the passive circuit ZC of the attenuator 14 that is connected to the input terminal of the virtual ground point providing circuit 15.

With this arrangement, the isolation active circuit MC can maintain a high isolation between the signal path of the attenuator 14 and the ground node of the variable gain amplifier 100. This means that the amount by which the distortion and noise generated in a circuit block other than the attenuator are mixed in the signal line of the attenuator via the IC ground node can be reduced. Since the SNDR is kept high even after receiving a signal voltage larger than the power supply voltage, a wide dynamic range can be realized even at low power supply voltage.

[First Exemplary Embodiment]

Figure 2:
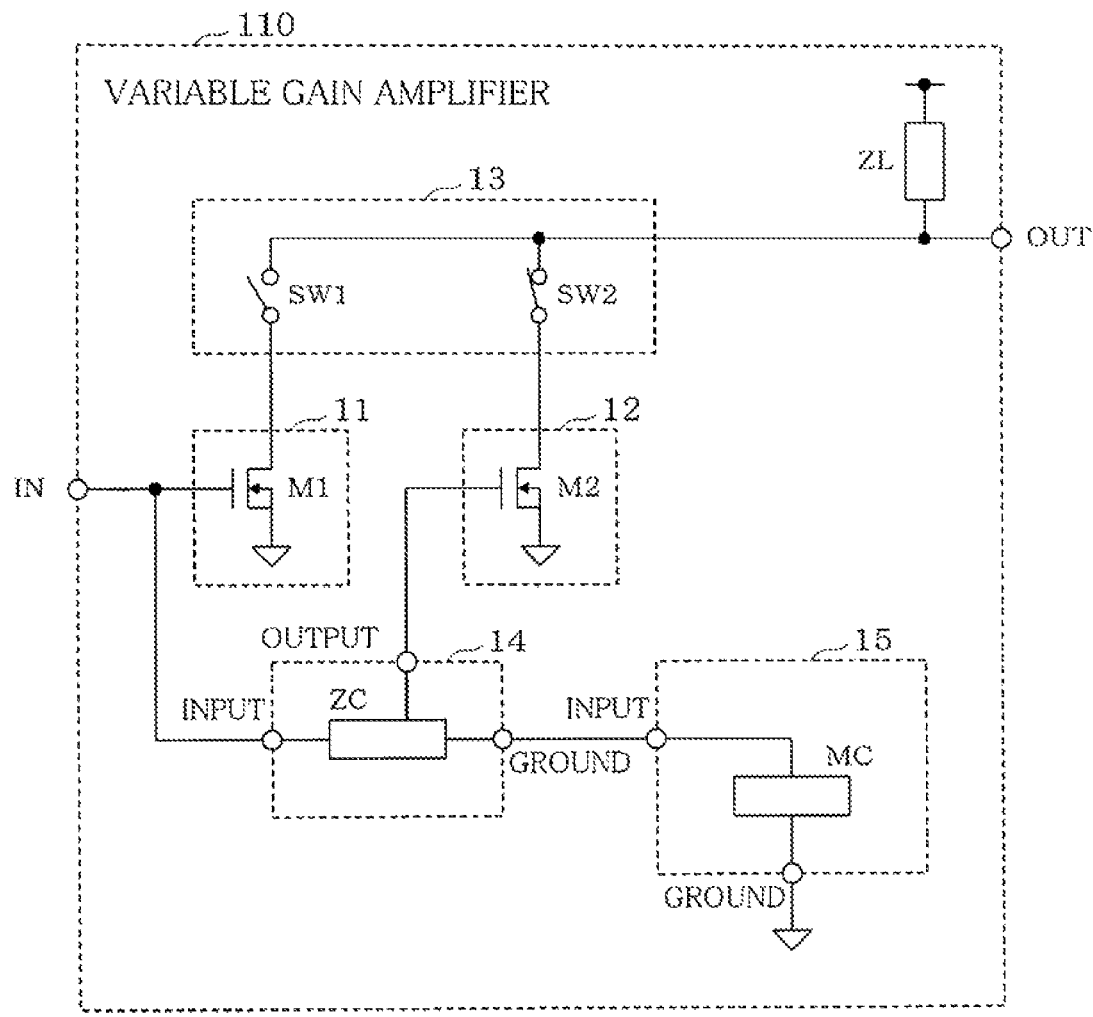
FIG. 2 is a circuit diagram showing the arrangement of a variable gain amplifier according to the first exemplary embodiment of the present invention.

A variable gain amplifier 110 according to the first exemplary embodiment of the present invention will be described with reference to FIG. 2. FIG. 2 is a circuit diagram showing the arrangement of the variable gain amplifier according to the first exemplary embodiment of the present invention.

The variable gain amplifier 110 includes a plurality of individual amplifiers, and has a function of variably controlling the gain by switching to one of the individual amplifiers by a switch and using it. The variable gain amplifier 110 includes, as main components, an individual amplifier (first individual amplifier) 11, individual amplifier (second individual amplifier) 12, switch 13, attenuator 14, and virtual ground point providing circuit 15. A case in which these components are formed as integrated circuits on a single semiconductor substrate will be exemplified.

The individual amplifier 11 includes an active element M1 having a control terminal connected to the input terminal IN of the variable gain amplifier 110. The individual amplifier 11 has a function of amplifying a signal input from the input terminal IN by the active element M1 and outputting the amplified signal.

The individual amplifier 12 includes an active element M2 having a control terminal connected to the output terminal of the attenuator 14. The individual amplifier 12 has a function of amplifying an attenuated signal from the output terminal of the attenuator 14 by the active element M2, and outputting the amplified signal.

The switch 13 has a function of switching to either of outputs from the individual amplifiers 11 and 12, and supplying it to the output terminal OUT of the variable gain amplifier 110.

The attenuator 14 includes a passive circuit ZC which is connected between the input terminal of the attenuator 14 that is connected to the input terminal IN, and the ground terminal of the attenuator 14. The attenuator 14 has a function of attenuating a signal input from the input terminal IN by the passive circuit ZC and outputting the attenuated signal from the output terminal of the attenuator 14.

The virtual ground point providing circuit 15 includes an isolation active circuit MC which is interposed between the input terminal of the virtual ground point providing circuit 15 that is connected to the ground terminal of the attenuator 14, and the ground node of the variable gain amplifier 110. The virtual ground point providing circuit 15 has a function of providing a virtual ground potential by the isolation active circuit MC to the input terminal of the virtual ground point providing circuit 15.

More specifically, the attenuator 14 includes the passive circuit ZC which is connected to the input terminal of the attenuator 14, the ground terminal of the attenuator 14, and the output terminal of the attenuator 14. The attenuator 14 operates the passive circuit ZC at a virtual ground potential provided from the virtual ground point providing circuit 15 to the ground terminal of the attenuator 14. As a consequence, the attenuator 14 attenuates a signal input from the input terminal IN of the variable gain amplifier 110, outputting the attenuated signal from the output terminal of the attenuator 14.

The individual amplifier 12 includes the active element M2 having a control terminal connected to the output terminal of the attenuator 14. The individual amplifier 12 amplifies the attenuated signal from the output terminal of the attenuator 14 by the active element M2, and outputs the amplified signal.

With this arrangement, the isolation active circuit MC can maintain a high isolation between the signal path of the attenuator 14 and the ground node of the variable gain amplifier 110. This means that the amount by which the distortion and noise generated in a circuit block other than the attenuator are mixed in the signal line of the attenuator via the IC ground node can be reduced. Since the SNDR is kept high even after receiving a signal voltage larger than the power supply voltage, a wide dynamic range can be realized even at low power supply voltage.

An arrangement example of the variable gain amplifier 110 according to the first exemplary embodiment of the present invention will be described in detail with reference to FIG. 2.

In the variable gain amplifier 110 of FIG. 2, the individual amplifier 11 is formed from a single active element including an N-type MOS field effect transistor (to be referred to as a MOSFET) M1. In this example, the MOSFET M1 has a gate terminal (control terminal) connected to the input terminal IN of the variable gain amplifier 110, a source terminal connected to the ground node of the variable gain amplifier 110, and a drain terminal connected to the switch 13.

The individual amplifier 12 is formed from a single active element including an N-type MOSFET M2. In this example, the MOSFET M2 has a gate terminal (control terminal) connected to the output terminal of the attenuator 14, a source terminal connected to the ground node of the variable gain amplifier 110, and a drain terminal connected to the switch 13.

The input terminal of the attenuator 14 is connected to the input terminal IN. A signal voltage input to the input terminal IN is directly input to the individual amplifier 11, and after being attenuated to a small signal voltage by the attenuator 14, input to the individual amplifier 12.

The switch 13 is formed from switching circuits SW1 and SW2 which are arranged in correspondence with the individual amplifiers 11 and 12. The input terminal of the switching circuit SW1 is connected to the drain terminal of the MOSFET M1, and that of the switching circuit SW2 is connected to the drain terminal of the MOSFET M2. The output terminals of the switching circuits SW1 and SW2 are connected to the output terminal OUT of the variable gain amplifier 110. A load resistance $Z_L$ is connected between the output terminal OUT and the power supply node.

The switching circuits SW1 and SW2 are ON/OFF-controlled based on a gain control signal (not shown) input from the outside of the variable gain amplifier 110, outputting an output from either the individual amplifier 11 or 12 via the output terminal OUT.

When the switch 13 selects an output from the individual amplifier 11, the gain of the variable gain amplifier 110 directly becomes the amplification factor of the individual amplifier 11. When the switch 13 selects an output from the individual amplifier 12, the gain of the variable gain amplifier 110 becomes a value obtained by dividing the amplification factor of the individual amplifier 12 by the attenuation factor of the attenuator 14.

In the variable gain amplifier 110 of FIG. 2, the ground terminal of the attenuator 14 is connected to the input terminal of the virtual ground point providing circuit 15, and the ground terminal of the virtual ground point providing circuit 15 is connected to the ground node of the variable gain amplifier 110. In the virtual ground point providing circuit 15, the isolation active circuit MC is connected between the input terminal and ground terminal of the virtual ground point providing circuit 15.

With this arrangement, the isolation active circuit MC can maintain a high isolation between the signal path of the attenuator 14 and the ground node of the variable gain amplifier 110. This means that the amount by which the distortion and noise generated in a circuit block other than the attenuator are mixed in the signal line of the attenuator via the IC ground node can be reduced. Since the SNDR is kept high even after receiving a signal voltage larger than the power supply voltage, a wide dynamic range can be realized even at low power supply voltage.

Hence, even if a signal voltage larger in amplitude than the power supply voltage is input, a serious decrease in SNDR can be avoided.

Figure 3:
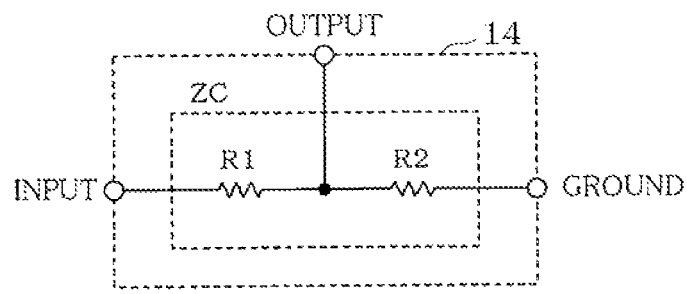
FIG. 3 is a circuit diagram showing an arrangement example of an attenuator in FIG. 2.

A practical arrangement example of the attenuator 14 of the variable gain amplifier 110 according to the first exemplary embodiment will be explained with reference to FIG. 3. FIG. 3 is a circuit diagram showing an arrangement example of the attenuator in FIG. 2.

The attenuator 14 in FIG. 3 includes the passive circuit ZC which forms a resistance division attenuator. Two resistors R1 and R2 are series-connected between the input terminal and ground terminal of the attenuator 14. The output terminal of the attenuator 14 is connected to the node between the resistors R1 and R2.

In the attenuator 14, an attenuation amount ATT1 when the ground terminal is connected to an ideal ground node is given by the sum of the resistance values of the resistors R1 and R2 with respect to the resistance value of the resistor R2:

[Mathematical 4]

$$ATT1 = \frac{R1 + R2}{R2} \qquad (4)$$

As shown in FIG. 2, the ground terminal of the attenuator 14 is connected to the input terminal of the virtual ground point providing circuit 15. In this case, an attenuation amount ATT2 of the attenuator 14 is rewritten to contain an input impedance $Z_{vin}$ at virtual ground point 1:

[Mathematical 5]

$$ATT2 = \frac{R1 + R2 + Z_{vin}}{R2 + Z_{vin}} \quad (5)$$

The $Z_{vin}$ value is not particularly limited. By setting $Z_{vin}$ to be much smaller than the resistors R1 and R2, the attenuation amount ATT2 becomes almost equal to the attenuation amount ATT1. This means that the input terminal of the virtual ground point providing circuit 15 serves as a virtual ground point with respect to the attenuator 14. If $Z_{vin}$ varies depending on the frequency, the parameter is set so that the absolute value of $Z_{vin}$ becomes much smaller than the resistors R1 and R2 within a desired frequency range. This setting can reduce variations of the attenuation amount ATT2 within the frequency range.

Figure 4:
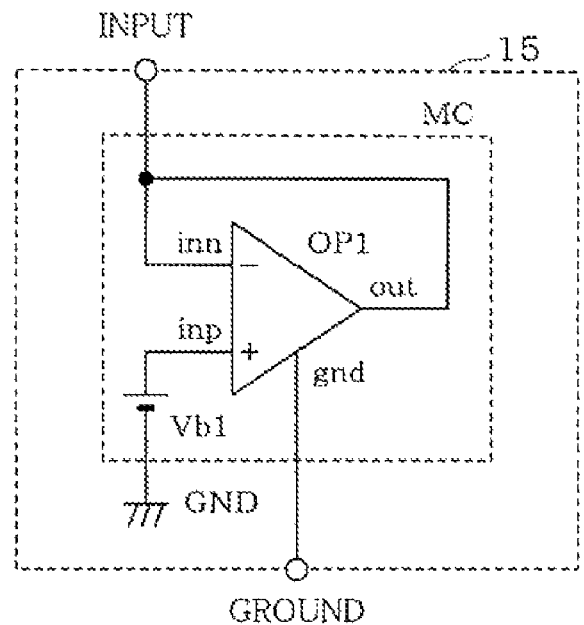
FIG. 4 is a circuit diagram showing an arrangement example of a virtual ground point providing circuit in FIG. 2.
Figure 5:
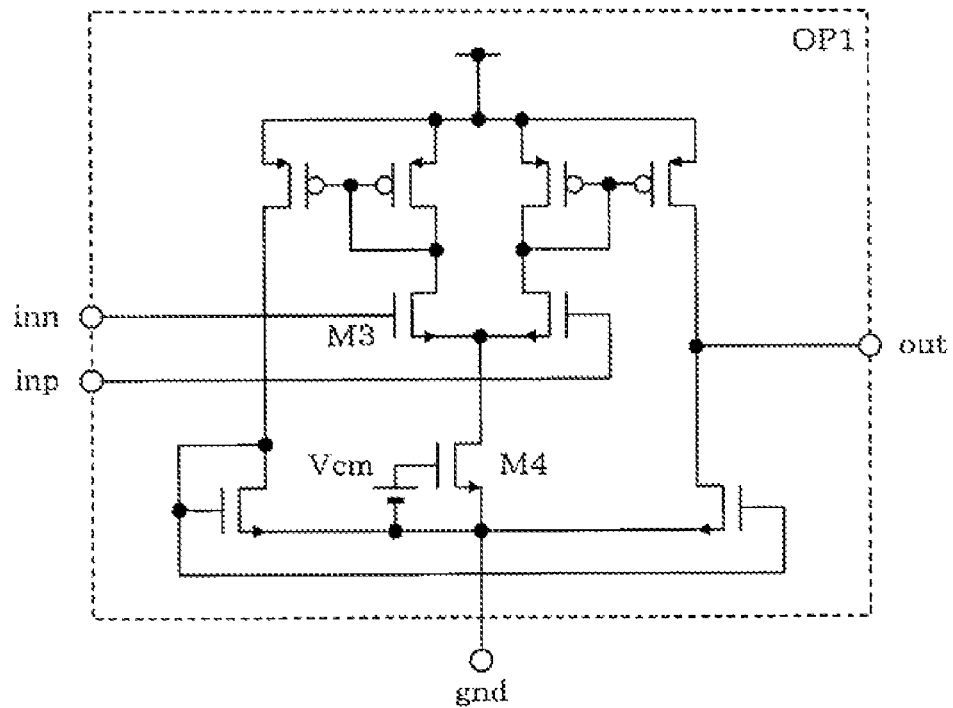
FIG. 5 is a circuit diagram showing an arrangement example of an operational amplifier in FIG. 4.

A practical arrangement example of the virtual ground point providing circuit 15 of the variable gain amplifier 110 according to the first exemplary embodiment will be explained with reference to FIGS. 4 and 5. FIG. 4 is a circuit diagram showing an arrangement example of the virtual ground point providing circuit in FIG. 2. FIG. 5 is a circuit diagram showing an arrangement example of an operational amplifier in FIG. 4.

The virtual ground point providing circuit 15 in FIG. 4 includes the isolation active circuit MC formed from an operational amplifier OP1. As represented by the following equation (6), the operational amplifier OP1 is a circuit which outputs, from an output terminal out, a current $I_{opo}$ proportional to the potential difference between a potential $V_{opp}$ at a non-inverting input terminal inp and a potential $V_{opn}$ at an inverting input terminal inn:
[Mathematical 6]

$$I_{opout} = A_v \cdot (V_{opp} - V_{opn}) \quad (6)$$

where $A_v$ is a constant of proportionality indicating the amplification factor of the operational amplifier.

The internal arrangement of the operational amplifier OP1 is based on a differential amplifier shown in FIG. 5. The non-inverting input terminal inp and inverting input terminal inn are connected to the gate terminals of corresponding NMOSFETs in the differential amplifier, respectively. This structure prevents a DC current from flowing from the non-inverting input terminal inp and inverting input terminal inn into OP1.

In the virtual ground point providing circuit 15, the input terminal of the virtual ground point providing circuit 15 is connected to the inverting input terminal inn of the operational amplifier OP1, and a bias voltage $V_{b1}$ is applied to the non-inverting input terminal inp. At this time, the ground terminal of $V_{b1}$ is connected to the ground potential GND of a ground node different from that of the variable gain amplifier 110. Thus, $V_{b1}$ is not affected by the noise and distortion generated at the ground node of the variable gain amplifier 110.

The operational amplifier OP1 employs a negative feedback arrangement in which the inverting input terminal inn is connected to the output terminal out of the operational amplifier OP1. If nothing is connected to the input terminal of the virtual ground point providing circuit 15, the output current of the operational amplifier OP1 cannot flow and becomes 0 (zero). At this time, $I_{opout}$ in equation (6) becomes 0, so the potential $V_{opn}$ at the inverting input terminal inn becomes equal to the bias potential $V_{b1}$ supplied to the non-inverting input terminal inp.

If a current $I_{in}$ is externally supplied to the input terminal of the virtual ground point providing circuit 15, an output current $I_{opout}$ of OP1 becomes $-I_{in}$ owing to the feedback operation of the operational amplifier OP1. Let $V_{in}$ be a shift from $V_b$ and $V_b + V_{in}$ be the potential at the input terminal. Then, substituting $V_b$ into $V_{opp}$ and $V_b + V_{in}$ into $V_{opn}$ in the above-described equation (6) yields the relation between $V_{in}$ and $I_{in}$:
[Mathematical 7]

$$I_{in} = A_v \cdot V_{in} \quad (7)$$

Equation (7) means that the input impedance of the virtual ground point providing circuit 15 is $1/A_v$. By setting $A_v$ to a sufficiently large value, the value of the input impedance can be set much smaller than the resistance values of both the resistors R1 and R2 which form the attenuator 14. That is, the input terminal of the virtual ground point providing circuit 15 can serve as a virtual ground point with respect to the attenuator 14. When the input terminal of the virtual ground point providing circuit 15 acts as a virtual ground point, no large voltage is input to the input terminal of the virtual ground point providing circuit 15. In other words, almost no distortion is generated in the virtual ground point providing circuit 15. From the viewpoint of avoiding generation of a large distortion, $A_v$ is desirably set to a large value.

As shown in FIG. 5, the input terminal of the virtual ground point providing circuit 15 is connected to the ground node of the variable gain amplifier 110 via, as the shortest path, a path passing through the inverting input terminal inn of the operational amplifier OP1, the gate and source terminals of a MOSFET M3, the drain and source terminals of a MOSFET M4, the ground terminal gnd of OP1, and the ground terminal of the virtual ground point providing circuit 15. In contrast, the MOSFET M4 is biased to the saturation region by a voltage source $V_{cm}$ having a ground terminal connected to the ground terminal gnd.

At this time, a drain-source current $I_{ds}$ in a MOSFET biased to the saturation region is generally given by

[Mathematical 8]

$$I_{ds} = \frac{\beta}{2 \cdot (V_g - V_s - V_{th})^2} \quad (8)$$

where $V_g$ is the gate potential, $V_s$ is the source voltage, $V_{th}$ is the threshold, and $\beta$ is a beta coefficient. $V_{th}$ and $\beta$ are MOSFET-specific constants.

In the MOSFET M4, the gate potential is $V_b$, and the source potential is the potential at the ground node of the variable gain amplifier 110, i.e., 0 V. Hence, a drain-source current $I_{dsM4}$ in the MOSFET M4 is given by

[Mathematical 9]

$$I_{dsM4} = \frac{\beta}{2 \cdot (V_{cm} - V_{th})^2} \quad (9)$$

In the operational amplifier OP1, when the potential at the ground terminal gnd varies, that at the source terminal of the MOSFET M4 varies by $\Delta V$, and that at its gate terminal changes to $V_{cm} + \Delta V$. Thus, the current $I_{dsM4}$ flowing from the drain terminal to source terminal of the MOSFET M4 is given by substituting $V_{cm}+\Delta V$ and $\Delta V$ into $V_g$ and $V_s$ of equation (8). At this time, $\Delta V$ is canceled, so the same value as that of the right-hand side of equation (9) is obtained. This means that even if the ground terminal varies under the influence of noise, distortion, or the like generated in an external circuit, the drain-source current of the MOSFET M4 does not change.

Currents flowing through the drain-source paths of all MOSFETs in the operational amplifier OP1 are proportional to that flowing through the drain-source path of the MOSFET M4. Considering this, the above-described fact reveals that variations of the ground terminal do not affect the output current characteristic of OP1. That is, the input impedance of the virtual ground point providing circuit 15 is not affected by variations of the ground terminal, and neither noise nor distortion generated at the ground node leaks to the signal path of the attenuator 14.

As described above, the first exemplary embodiment can maintain a high isolation between the signal path of the attenuator 14 and the ground node of the variable gain amplifier 110, compared to an arrangement in which the ground terminal of the attenuator 14 is directly connected to the ground node of the variable gain amplifier 110. The first exemplary embodiment can, therefore, decrease the amount by which the distortion and noise generated in a circuit block other than the attenuator 14 are mixed in the signal line of the attenuator 14 via the ground node of the variable gain amplifier 110.

Even if a signal voltage larger than the power supply voltage is input, the SNDR can be kept high. A wide dynamic range can be realized even at low power supply voltage, avoiding a serious decrease in SNDR.

[Second Exemplary Embodiment]

Figure 6:
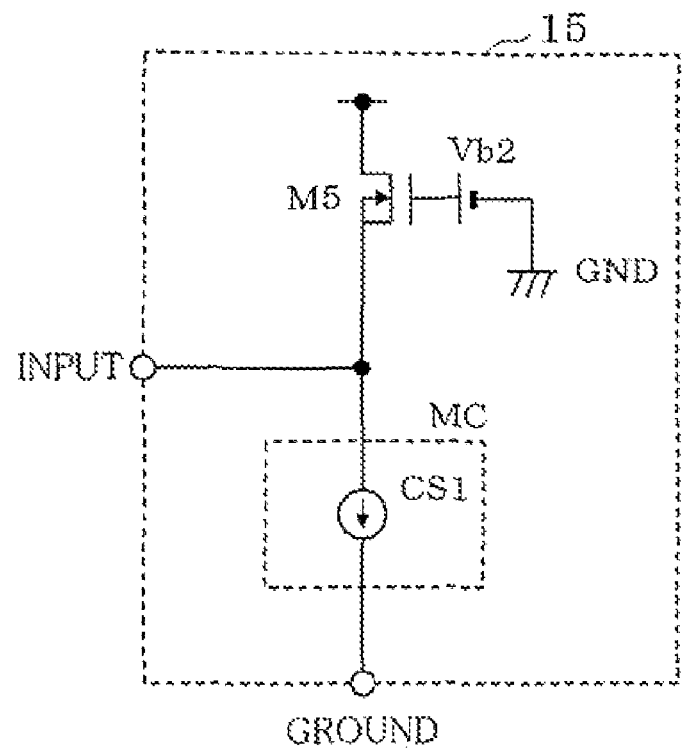
FIG. 6 is a circuit diagram showing an arrangement example of the virtual ground point providing circuit of a variable gain amplifier according to the second exemplary embodiment of the present invention.

A variable gain amplifier according to the second exemplary embodiment of the present invention will be described with reference to FIG. 6. FIG. 6 is a circuit diagram showing an arrangement example of the virtual ground point providing circuit of the variable gain amplifier according to the second exemplary embodiment of the present invention.

In the first exemplary embodiment, the virtual ground point providing circuit 15 is formed from the isolation active circuit MC including the operational amplifier OP1. In the second exemplary embodiment, a virtual ground point providing circuit 15 is formed from an isolation active circuit MC including a current source CS1 and MOSFET M5. Note that an arrangement other than the virtual ground point providing circuit 15 is the same as that of the first exemplary embodiment shown in FIG. 2, and a detailed description thereof will not be repeated.

The virtual ground point providing circuit 15 in FIG. 6 includes the current source CS1 and MOSFET M5.

The current source CS1 corresponds to the active circuit MC which is connected between the input terminal and ground terminal of the virtual ground point providing circuit 15. The MOSFET M5 is formed from an N-type MOSFET biased to the saturation region. The MOSFET M5 has a drain terminal connected to the power supply node of a variable gain amplifier 110, a source terminal connected to the input terminal of the virtual ground point providing circuit 15, and a gate terminal connected to a fixed voltage source $V_{b2}$. Note that the ground terminal of $V_{b2}$ is connected to the ground potential GND of a ground node different from the ground node of the variable gain amplifier 110. With this structure, $V_{b2}$ is not affected by the noise or distortion generated at the ground node of the variable gain amplifier 110.

Figure 7:
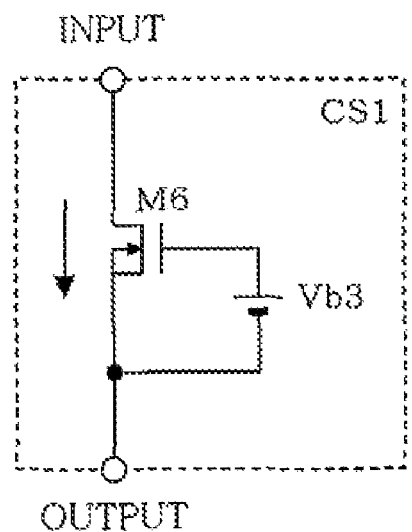
FIG. 7 is a circuit diagram showing an arrangement example of a current source in FIG. 6.

FIG. 7 is a circuit diagram showing an arrangement example of the current source in FIG. 6. The current source CS1 is formed from an N-type MOSFET M6 biased to the saturation region. The MOSFET M6 has a gate terminal connected to a voltage source $V_{b3}$, a source terminal connected to the ground terminal of the virtual ground point providing circuit 15 via the output terminal of the current source CS1, and a drain terminal connected to the input terminal of the virtual ground point providing circuit 15 via the input terminal of the current source CS1. The ground terminal of the voltage source $V_{b3}$ is connected to the output terminal of the current source CS1.

The MOSFETs M5 and M6 are almost equal in size. The input impedance of the virtual ground point providing circuit 15 according to the second exemplary embodiment is equal to the reciprocal of the sum of the gm value (mutual conductance) $gm_{M5}$ of the MOSFET M5 and the drain conductance of the MOSFET M6. In a MOS field effect transistor in the saturation region, the gm value is generally 100 times or more than the drain conductance value, and thus the input impedance of the virtual ground point providing circuit 15 is approximated by the reciprocal of $gm_{M5}$. By setting the reciprocal of $gm_{M5}$ to a value much smaller than the impedance value of a passive element which forms an attenuator 14, the input terminal of the virtual ground point providing circuit 15 can serve as a virtual ground point with respect to the attenuator 14.

The input terminal of the virtual ground point providing circuit 15 is connected to the ground node of the variable gain amplifier 110 via the MOSFET M6 biased to the saturation region. The drain-source current value of the MOSFET M6 does not change even upon variations of the potential of the ground terminal owing to the distortion or noise generated in another circuit block or the like. The reason for this is the same as that described for the MOSFET M4 which forms the operational amplifier OP1 in the first exemplary embodiment.

In this way, the second exemplary embodiment can also maintain a high isolation between the signal path of the attenuator 14 and the ground node of the variable gain amplifier 110, compared to an arrangement in which the ground terminal of the attenuator 14 is directly connected to that of the variable gain amplifier 110. Accordingly, the second exemplary embodiment can decrease the amount by which the distortion and noise generated in a circuit block other than the attenuator 14 are mixed in the signal line of the attenuator 14 via the ground node of the variable gain amplifier 110.

Even if a signal voltage larger than the power supply voltage is input, the SNDR can be kept high. A wide dynamic range can be realized even at low power supply voltage, avoiding a serious decrease in SNDR.

[Third Exemplary Embodiment]

Figure 8:
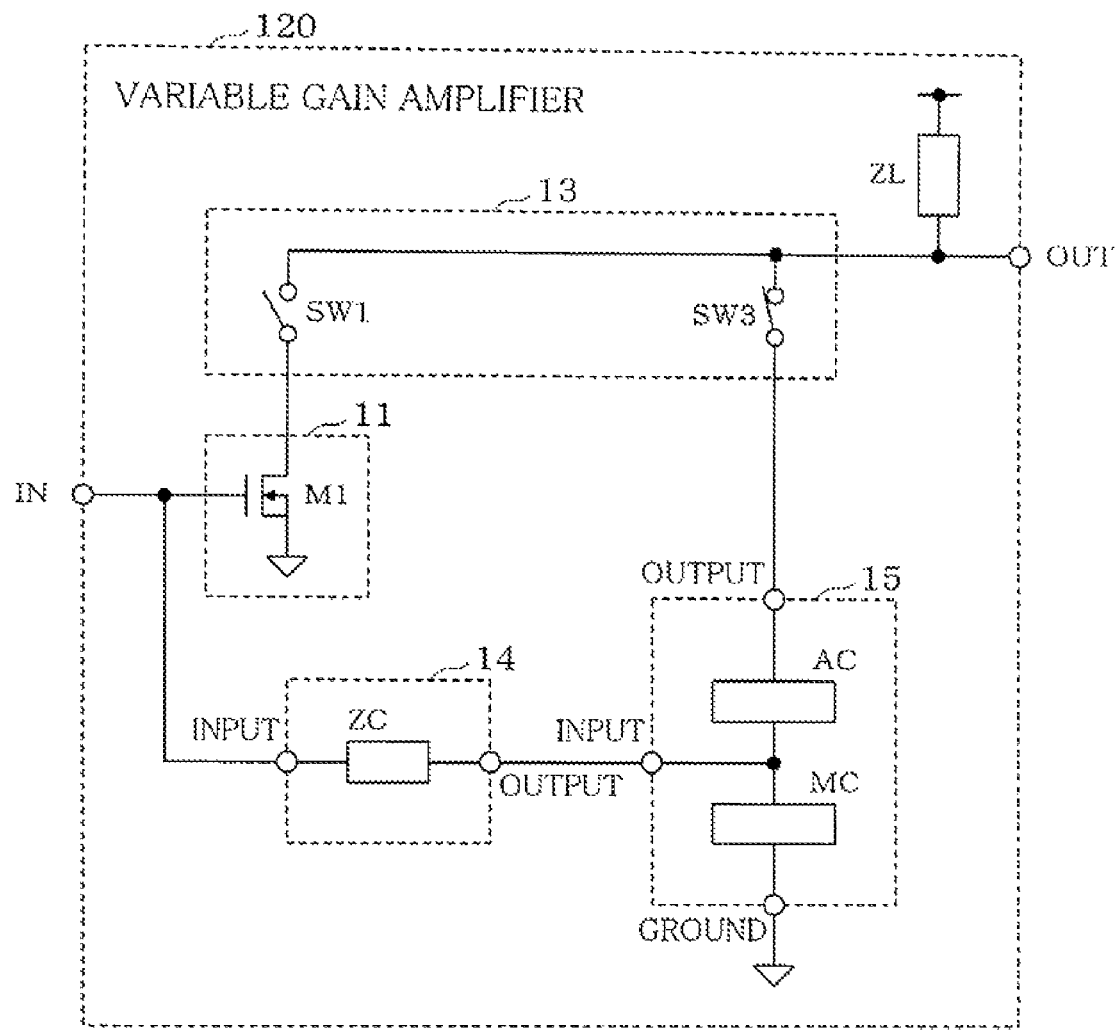
FIG. 8 is a circuit diagram showing the arrangement of a variable gain amplifier according to the third exemplary embodiment of the present invention.

A variable gain amplifier 120 according to the third exemplary embodiment of the present invention will be described with reference to FIG. 8. FIG. 8 is a circuit diagram showing the arrangement of the variable gain amplifier according to the third exemplary embodiment of the present invention. The same reference numerals as those in FIG. 2 denote the same or similar parts.

In the first exemplary embodiment, the individual amplifier 12 identical to the individual amplifier 11 is arranged to amplify and output an attenuated signal from the attenuator 14. In the variable gain amplifier 120 of the third exemplary embodiment, the MOSFET of a virtual ground point providing circuit 15 also serves as an individual amplifier AC (second individual amplifier) which replaces the individual amplifier 12.

In the variable gain amplifier 120, the virtual ground point providing circuit 15 includes an isolation active circuit MC and the individual amplifier AC. The isolation active circuit MC is interposed between the input terminal of the virtual ground point providing circuit 15 that is connected to the output terminal of an attenuator 14, and the ground node of the variable gain amplifier 120. The individual amplifier AC is connected to the input terminal of the virtual ground point providing circuit. The virtual ground point providing circuit 15 has a function of providing a virtual ground potential by the isolation active circuit MC to the input terminal of the virtual ground point providing circuit 15, and amplifying an attenuated signal from the output terminal of the attenuator 14 by the individual amplifier AC to output the amplified signal.

The attenuator 14 includes a passive circuit ZC which is connected between the input terminal of the attenuator 14 that is connected to the input terminal IN, and the output terminal of the attenuator 14. The attenuator 14 has a function of attenuating a signal input from the input terminal IN by the passive circuit ZC and outputting the attenuated signal from the output terminal of the attenuator 14.

A switch 13 has a function of switching to either of outputs from an individual amplifier 11 and the individual amplifier AC, and supplying it to the output terminal OUT of the variable gain amplifier 120.

More specifically, the attenuator 14 includes the passive circuit ZC which is connected between the input terminal and output terminal of the attenuator 14. The attenuator 14 operates the passive circuit ZC at a virtual ground potential provided from the virtual ground point providing circuit 15 to the output terminal of the attenuator 14. As a result, the attenuator 14 attenuates a signal input from the input terminal IN of the variable gain amplifier 120, outputting the attenuated signal from the output terminal of the attenuator 14.

With this arrangement, the isolation active circuit MC can maintain a high isolation between the signal path of the attenuator 14 and the ground node of the variable gain amplifier 120. This means that the amount by which the distortion and noise generated in a circuit block other than the attenuator are mixed in the signal line of the attenuator via the IC ground node can be reduced. Since the SNDR is kept high even after receiving a signal voltage larger than the power supply voltage, a wide dynamic range can be realized even at low power supply voltage.

An arrangement example of the variable gain amplifier 120 according to the third exemplary embodiment of the present invention will be described in detail with reference to FIG. 8.

In the variable gain amplifier 120 of FIG. 8, the individual amplifier 11 is formed from a single active element including an N-type MOS field effect transistor (to be referred to as a MOSFET) M1. In this example, the MOSFET M1 has a gate terminal (control terminal) connected to the input terminal IN of the variable gain amplifier 120, a source terminal connected to the ground node of the variable gain amplifier 120, and a drain terminal connected to the switch 13.

The input terminal of the attenuator 14 is connected to the input terminal IN. A signal voltage input to the input terminal IN is directly input to the individual amplifier 11, and after being attenuated to a small signal voltage by the attenuator 14, input to the individual amplifier AC of the virtual ground point providing circuit 15.

The switch 13 is formed from switching circuits SW1 and SW3 which are arranged in correspondence with the individual amplifiers 11 and AC. The input terminal of the switching circuit SW1 is connected to the drain terminal of the MOSFET M1, and that of the switching circuit SW3 is connected to the output terminal of the individual amplifier AC. The output terminals of the switching circuits SW1 and SW3 are connected to the output terminal OUT of the variable gain amplifier 120. A load resistance $Z_L$ is connected between the output terminal OUT and the power supply node.

The switching circuits SW1 and SW3 are ON/OFF-controlled based on a gain control signal (not shown) input from the outside of the variable gain amplifier 120, outputting an output from either the individual amplifier 11 or AC via the output terminal OUT.

When the switch 13 selects an output from the individual amplifier 11, the gain of the variable gain amplifier 120 directly becomes the amplification factor of the individual amplifier 11. When the switch 13 selects an output from the individual amplifier AC, the gain of the variable gain amplifier 120 becomes a value obtained by dividing the amplification factor of the individual amplifier AC by the attenuation factor of the attenuator 14.

Let $A_{mp1}$ is the voltage-to-current conversion gain of the individual amplifier 11, Amp_att be the voltage-to-current conversion ratio of the attenuator 14, $A_{v2}$ be the current amplification factor between the input and output terminals of the virtual ground point providing circuit 15, and $Z_L$ be the impedance of the load resistance $Z_L$. Then, when an output from the individual amplifier 11 is selected, a gain $A_{vSW1ON}$ of the variable gain amplifier 120 is given by

[Mathematical 10]

$$A_{vSW1ON} = Z_L \cdot \mathrm{Amp1} \tag{10}$$

To the contrary, when an output from the virtual ground point providing circuit 15 is selected, a gain $A_{vSW2ON}$ of the variable gain amplifier 120 is given by

[Mathematical 11]

$$A_{vSW2ON} = Z_L \cdot A_{v2} \cdot \mathrm{Amp\_att} \tag{11}$$

In the third exemplary embodiment, $A_{mp1}$ is set to a value larger than the product of $A_{v2}$ and Amp_att. When an output from the individual amplifier 11 is selected, the gain becomes larger than that when an output from the virtual ground point providing circuit 15 is selected.

Figure 9:
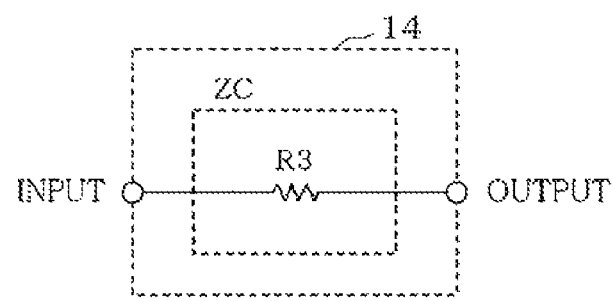
FIG. 9 is a circuit diagram showing an arrangement example of an attenuator in FIG. 8.

A concrete arrangement example of the attenuator 14 of the variable gain amplifier 120 according to the third exemplary embodiment will be explained with reference to FIG. 9. FIG. 9 is a circuit diagram showing an arrangement example of the attenuator in FIG. 8.

The attenuator 14 in FIG. 9 is formed from a passive circuit ZC including a single resistor R3. The input and output terminals of the attenuator 14 are connected to the two ends of the resistor R3, respectively.

Letting $Z_{vin2}$ be the input impedance of the virtual ground point providing circuit 15, an impedance $Z_{aLL}$ of the inside of the attenuator 14 relative to the input terminal of the attenuator 14 in FIG. 8 is given by

[Mathematical 12]

$$Z_{att} = Z_{vin2} + R3 \tag{12}$$

From equation (12), if $Z_{vin2}$ is much smaller than R3, $Z_{att}$ is approximated to be R3. This means that the input terminal of the virtual ground point providing circuit 15 serves as a virtual ground point.

Figure 10:
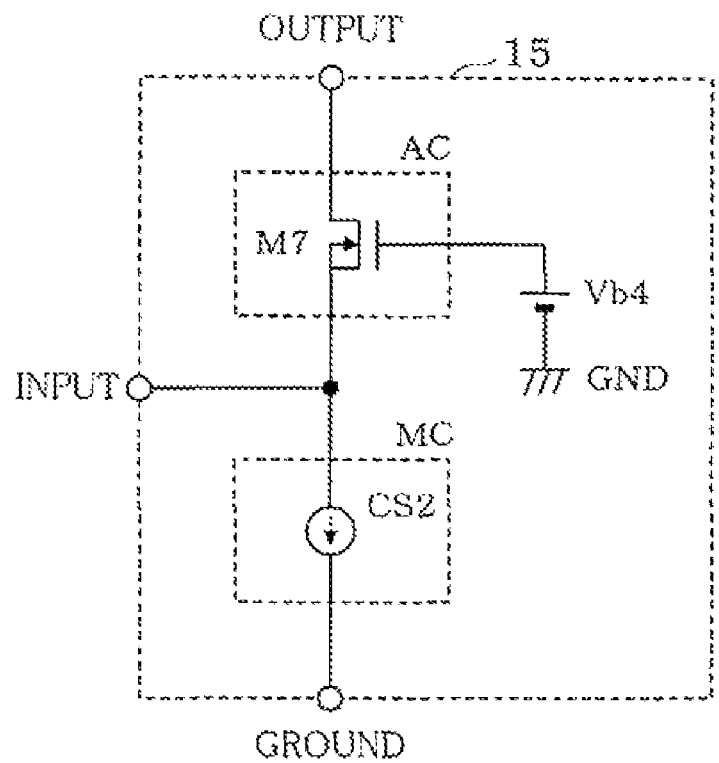
FIG. 10 is a circuit diagram showing an arrangement example of a virtual ground point providing circuit in FIG. 8.

A practical arrangement example of the virtual ground point providing circuit 15 of the variable gain amplifier 120 according to the third exemplary embodiment will be explained with reference to FIG. 10. FIG. 10 is a circuit diagram showing an arrangement example of the virtual ground point providing circuit in FIG. 8.

The virtual ground point providing circuit 15 in FIG. 10 includes a current source CS2 and MOSFET M7.

The current source CS2 corresponds to the active circuit MC which is connected between the input terminal and ground terminal of the virtual ground point providing circuit 15. The MOSFET M7 corresponds to the individual amplifier AC which is connected to the input terminal of the virtual ground point providing circuit.

The MOSFET M7 is formed from an N-type MOSFET biased to the saturation region. The MOSFET M7 has a drain terminal connected to the switching circuit SW3 of the switch 13 via the output terminal of the virtual ground point providing circuit 15, a source terminal connected to the input terminal of the virtual ground point providing circuit 15, and a gate terminal connected to a fixed voltage source $V_{b4}$. Note that the ground terminal of $V_{b4}$ is connected to the ground potential GND of a ground node different from the ground node of the variable gain amplifier 120. Thus, $V_{b4}$ is not affected by the noise or distortion generated at the ground node of the variable gain amplifier 120.

Figure 11:
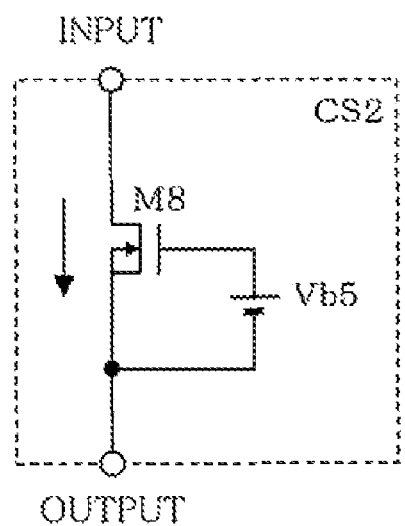
FIG. 11 is a circuit diagram showing an arrangement example of a current source in FIG. 10.

FIG. 11 is a circuit diagram showing an arrangement example of the current source in FIG. 10. The current source CS2 is formed from an N-type MOSFET M8 biased to the saturation region. The MOSFET M8 has a gate terminal connected to a voltage source $V_{b5}$, a source terminal connected to the ground terminal of the virtual ground point providing circuit 15 via the output terminal of the current source CS2, and a drain terminal connected to the input terminal of the virtual ground point providing circuit 15 via the input terminal of the current source CS2. The ground terminal of the voltage source $V_{b5}$ is connected to the output terminal of the current source CS2.

The MOSFETs M7 and M8 are almost equal in size. The input impedance of the virtual ground point providing circuit 15 according to the third exemplary embodiment is equal to the reciprocal of the sum of the gm value (mutual conductance) $gm_{M7}$ of the MOSFET M7 and the drain conductance of the MOSFET M8. In a MOS field effect transistor in the saturation region, the gm value is generally 100 times or more than the drain conductance value, so the input impedance of the virtual ground point providing circuit 15 is approximated by the reciprocal of $gm_{M7}$. By setting the reciprocal of $gm_{M7}$ to a value much smaller than the impedance value of a passive element which forms the attenuator 14, the input terminal of the virtual ground point providing circuit 15 can function as a virtual ground point with respect to the attenuator 14.

The input terminal of the virtual ground point providing circuit 15 is connected to the ground node of the variable gain amplifier 120 via the MOSFET M8 biased to the saturation region. The drain-source current value of the MOSFET M8 does not change even upon variations of the potential of the ground terminal owing to a distortion or noise generated in another circuit block or the like. The reason for this is the same as that described for the MOSFET M4 which forms the operational amplifier OP1 in the first exemplary embodiment.

When the switching circuit SW3 of the switch 13 is controlled to be ON, the drain terminal of the MOSFET M7 is connected not to the power supply node of the variable gain amplifier 120 but to the output terminal OUT and load resistance $Z_L$ via the switching circuit SW3 of the switch 13. Hence, the MOSFET M7 amplifies an attenuated signal input from the attenuator 14 to the input terminal of the virtual ground point providing circuit 15, outputting the amplified signal from the output terminal OUT.

At this time, the virtual ground point providing circuit 15 directly outputs, from its output terminal, a current supplied via the input terminal of the virtual ground point providing circuit 15. That is, the current amplification factor $A_{v2}$ of the virtual ground point providing circuit 15 is 1. The voltage-to-current conversion ratio Amp_att of the attenuator 14 is represented by the reciprocal of the input impedance $Z_{att}$ of the attenuator 14. In the above description, $Z_{att}$ can be regarded as R3 approximately. Thus, Amp_att is approximated to be 1/R3.

In the third exemplary embodiment, therefore, when an output from the virtual ground point providing circuit 15 is selected as the output, a gain $A_{vSW3ON}$ is given by substituting 1 and 1/R3 into $A_{v2}$ and Amp_att on the right-hand side of equation (11):

[Mathematical 13]

$$A_{vSW3ON} = \frac{Z_L}{R3} \qquad (13)$$

In this fashion, the third exemplary embodiment can also maintain a high isolation between the signal path of the attenuator 14 and the ground node of the variable gain amplifier 120, compared to an arrangement in which the ground terminal of the attenuator 14 is directly connected to that of the variable gain amplifier 120. The third exemplary embodiment can decrease the amount by which the distortion and noise generated in a circuit block other than the attenuator 14 are mixed in the signal line of the attenuator 14 via the ground node of the variable gain amplifier 120.

Even if a signal voltage larger than the power supply voltage is input, the SNDR can be kept high. A wide dynamic range can be implemented even at low power supply voltage, avoiding a serious decrease in SNDR. Further, the MOSFET M7 of the virtual ground point providing circuit 15 can also be used as an individual amplifier, which can simplify the circuit arrangement.

Figure 12:
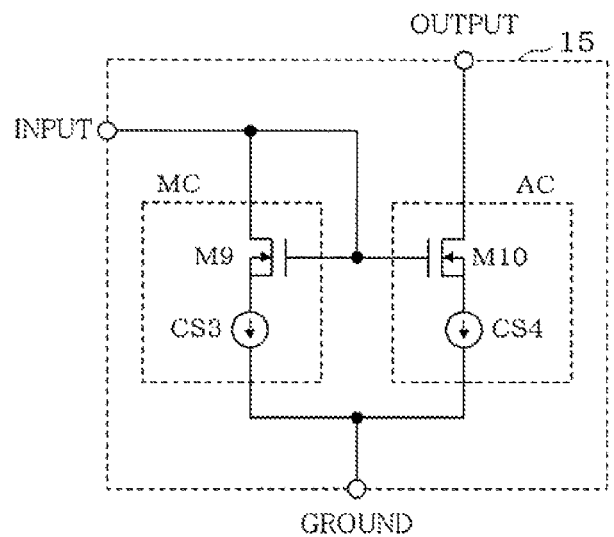
FIG. 12 is a circuit diagram showing another an arrangement example of the virtual ground point providing circuit in FIG. 8.

Another practical arrangement example of the virtual ground point providing circuit 15 of the A variable gain amplifier 120 according to the third exemplary embodiment will be described with reference to FIG. 12. FIG. 12 is a circuit diagram showing another an arrangement example of the virtual ground point providing circuit in FIG. 8.

FIG. 10 shows an example in which the virtual ground point providing circuit 15 includes the isolation active circuit MC which is interposed between the input terminal of the virtual ground point providing circuit 15 and the ground node of the variable gain amplifier 120, and the individual amplifier AC connected to the input terminal of the virtual ground point providing circuit. FIG. 12 shows an example in which an isolation active circuit MC and individual amplifier AC are formed from a current mirror circuit.

The virtual ground point providing circuit 15 includes a current mirror circuit formed from the isolation active circuit MC and individual amplifier AC. The virtual ground point providing circuit 15 outputs, from its output terminal, a current equivalent to the product of a current input from the input terminal of the virtual ground point providing circuit 15, and a mirror ratio RM. In FIG. 12, MOSFETs M9 and M10 are a pair of MOSFETs which form the current mirror circuit. The gate width of the MOSFET M10 is equal to the product of the gate width of the MOSFET M9 and the mirror ratio RM.

The common gate terminal of the paired MOSFETs and the drain terminal of the MOSFET M9 are connected to the input terminal of the virtual ground point providing circuit 15. The source terminal of the MOSFET M9 is connected to the input terminal of a current source CS3, and that of the MOSFET M10 is connected to the input terminal of a current source CS4. The current value of the current source CS4 is equal to the product of the current source CS3 and mirror ratio RM.

The input impedance $Z_{vin2}$ of the virtual ground point providing circuit 15 is represented by the reciprocal of the gm value $gm_{M9}$ of the MOSFET M9. The reciprocal of $gm_{M9}$ is set to a value (1/10 or less) much smaller than a resistor R3 which forms an attenuator 14. As described in the arrangement example shown in FIG. 10, the impedance $Z_{att}$ of the inside of the attenuator 14 relative to the input terminal of the attenuator 14 can be regarded as R3 approximately. In other words, the input terminal of the virtual ground point providing circuit 15 can be regarded as a virtual ground point.

In the virtual ground point providing circuit 15, the input terminal of the virtual ground point providing circuit 15 is connected to the ground terminal of the variable gain amplifier 120 via the isolation active circuit MC. In this arrangement example, the current source CS3 is formed from a MOSFET biased to the saturation region, similar to the current source CS2 shown in FIG. 10. With this arrangement, the current value of CS3 does not change even upon variations of the potential of the ground terminal owing to a distortion or noise generated in another circuit block or the like.

When a switching circuit SW3 of a switch 13 is controlled to be ON, the drain terminal of the MOSFET M10 is connected to the output terminal OUT and load resistance $Z_L$ via the switching circuit SW3 of the switch 13. As a result, the MOSFET M10 amplifies an attenuated signal input from the attenuator 14 to the input terminal of the virtual ground point providing circuit 15, outputting the amplified signal from the output terminal OUT.

At this time, the current amplification factor $A_{v2}$ is RM in the virtual ground point providing circuit 15. The voltage-to-current conversion ratio ATT2 of the attenuator 14 is represented by the reciprocal of the input impedance of the attenuator 14. Considering equation (10) and the fact that $Z_{vin2}$ is much smaller than R3, ATT2 equals the reciprocal of R3.

In this arrangement example, when an output from the virtual ground point providing circuit 15 is selected as the output, the gain $A_{vSW3ON}$ in this arrangement example is given by substituting RM and 1/R3 into $A_{v2}$ and Amp_att on the right-hand side of equation (11):

[Mathematical 14]

$$A_{vSW3ON} = \frac{Z_L \cdot RM}{R3} \quad (14)$$

This arrangement example can also maintain a high isolation between the signal path of the attenuator 14 and the ground node of the variable gain amplifier 120, compared to an arrangement in which the ground terminal of the attenuator 14 is directly connected to that of the variable gain amplifier 120. This arrangement example can decrease the amount by which the distortion and noise generated in a circuit block other than the attenuator 14 are mixed in the signal line of the attenuator 14 via the ground node of the variable gain amplifier 120.

Even if a signal voltage larger than the power supply voltage is input, the SNDR can be kept high. A wide dynamic range can be implemented even at low power supply voltage, avoiding a serious decrease in SNDR. In addition, the MOSFET M10 of the virtual ground point providing circuit 15 can also be used as an individual amplifier, which can simplify the circuit arrangement.

[Fourth Exemplary Embodiment]

Figure 13:
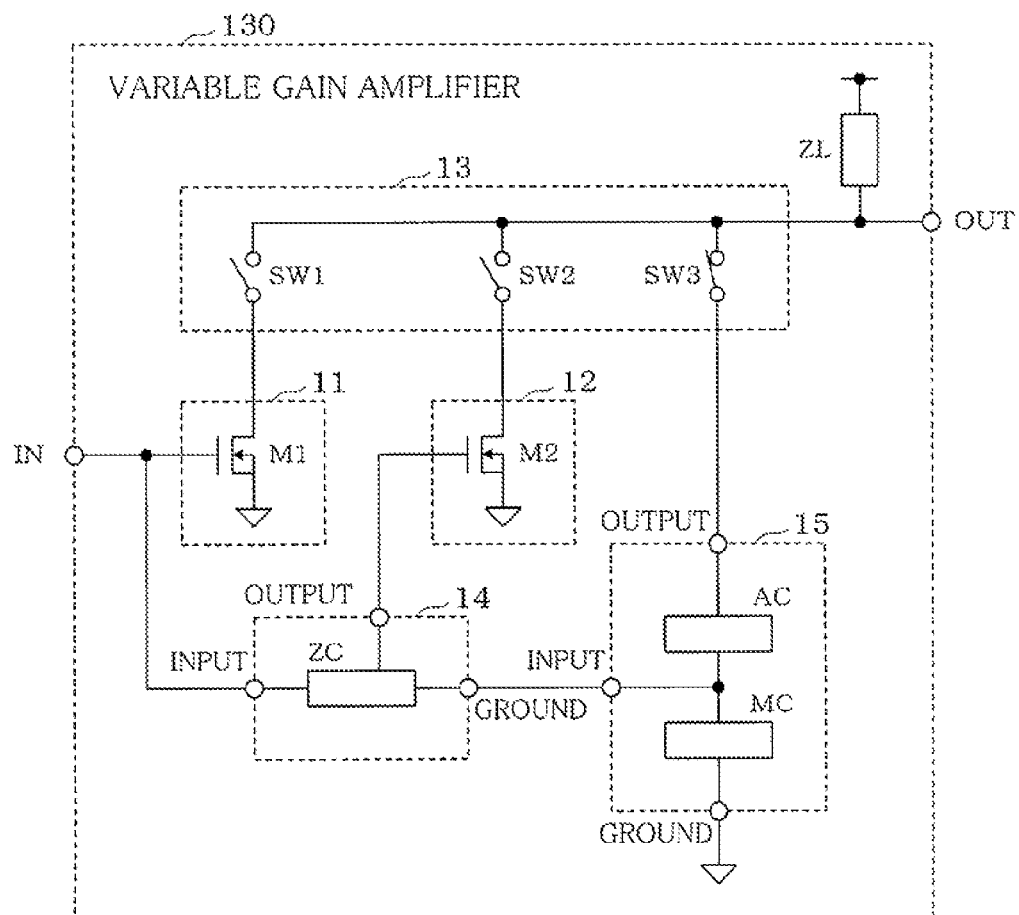
FIG. 13 is a circuit diagram showing the arrangement of a variable gain amplifier according to the fourth exemplary embodiment of the present invention.
Figure 14:
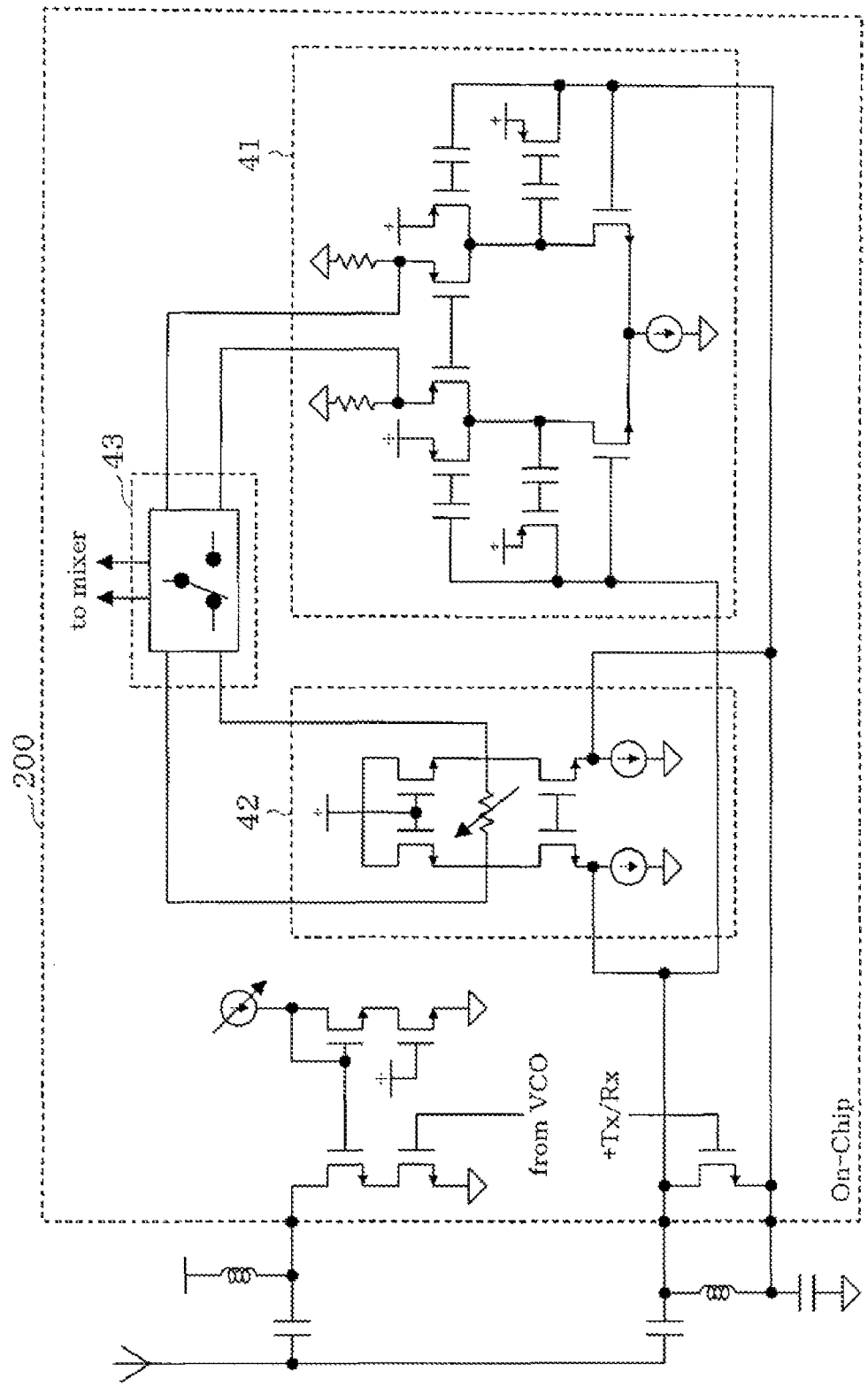
FIG. 14 shows the first arrangement example concerning a variable gain amplifier.
Figure 15:
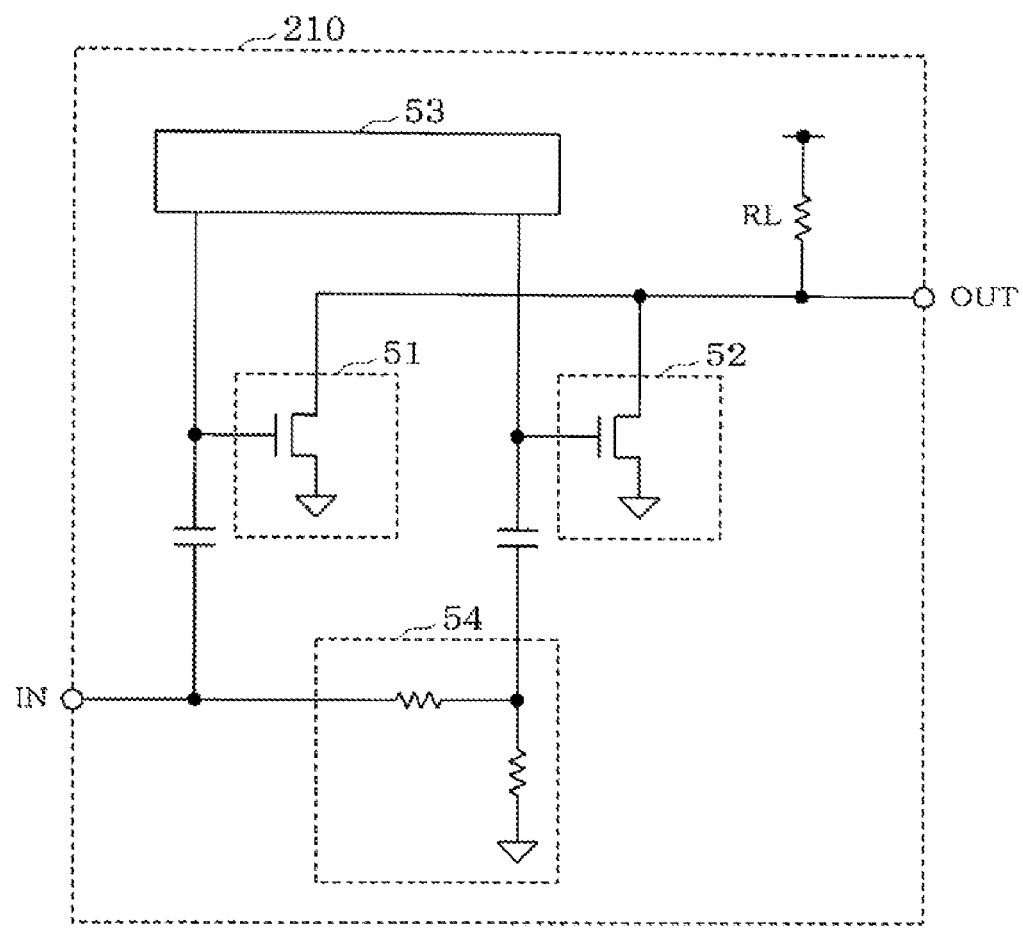
FIG. 15 shows the second arrangement example concerning a variable gain amplifier.

A variable gain amplifier 130 according to the fourth exemplary embodiment of the present invention will be described with reference to FIG. 13. FIG. 13 is a circuit diagram showing the arrangement of the variable gain amplifier according to the fourth exemplary embodiment of the present invention. The same reference numerals as those in FIGS. 2 and 3 denote the same or similar parts.

In the fourth exemplary embodiment, the third exemplary embodiment is applied to the first exemplary embodiment.

The variable gain amplifier 130 according to the fourth exemplary embodiment adopts the virtual ground point providing circuit 15 in FIG. 10 according to the third exemplary embodiment, instead of the virtual ground point providing circuit 15 in the arrangement of the variable gain amplifier 110 according to the first exemplary embodiment.

Switching circuits SW1, SW2, and SW3 of a switch 13 are ON/OFF-controlled based on a gain control signal (not shown) input from the outside of the variable gain amplifier 130, outputting an output from one of individual amplifiers 11, 12, and AC via the output terminal OUT.

As described above, the fourth exemplary embodiment can also maintain a high isolation between the signal path of an attenuator 14 and the ground node of the variable gain amplifier 130, compared to an arrangement in which the ground terminal of the attenuator 14 is directly connected to that of the variable gain amplifier 130. Thus, the fourth exemplary embodiment can decrease the amount by which the distortion and noise generated in a circuit block other than the attenuator 14 are mixed in the signal line of the attenuator 14 via the ground node of the variable gain amplifier 130.

Even if a signal voltage larger than the power supply voltage is input, the SNDR can be kept high. A wide dynamic range can be realized even at low power supply voltage, avoiding a serious decrease in SNDR. Further, a MOSFET M7 of the virtual ground point providing circuit 15 can also be used as an individual amplifier, and three different amplification factors can be selected using a simple circuit arrangement.

[Modification of Exemplary Embodiments]

In the above-described exemplary embodiments, circuit units which constitute the variable gain amplifier are formed as integrated circuits on a single semiconductor substrate. However, the present invention is not limited to this, and these circuit units may be separately formed on a plurality of semiconductor substrates.

Moreover, in the above-described exemplary embodiments, the MOSFET is used as an active element. However, the present invention is not limited to this, and, for example, a bipolar transistor is also available as an active element. In this case, the bipolar transistor can easily replace the MOSFET by regarding, for example, the gate terminal, drain terminal, and source terminal of an N-type MOSFET as the base terminal, collector terminal, and emitter terminal of an NPN bipolar transistor.

Industrial Applicability

The variable gain amplifier according to the present invention is used in a general radio receiver and is very useful especially for a power-saving radio receiver which operates using a battery.

What is claimed is:

1. A variable gain amplifier which includes a plurality of individual amplifiers and variably controls a gain by switching to and using one of the individual amplifiers, comprising:

an individual amplifier which amplifies a signal input from an input terminal of the variable gain amplifier by an active element, and outputs the input signal;

an attenuator which attenuates the input signal by a passive circuit, and outputs the input signal as an attenuated signal; and a virtual ground point providing circuit,
wherein said virtual ground point providing circuit includes an isolation active circuit interposed between an input terminal of said virtual ground point providing circuit and a ground node of the variable gain amplifier, and provides, by the isolation active circuit, a virtual ground potential to the passive circuit of said attenuator that is connected to the input terminal of said virtual ground point providing circuit, and
wherein the isolation active circuit includes one of a field effect transistor biased to a saturation region and a bipolar transistor biased to a saturation region.

2. A variable gain amplifier according to claim 1, wherein said attenuator includes the passive circuit connected to an input terminal of said attenuator, a ground terminal of said attenuator, and an output terminal of said attenuator, operates the passive circuit at the virtual ground potential provided from said virtual ground point providing circuit to the ground terminal of said attenuator to attenuate the input signal from the input terminal of the variable gain amplifier, and outputs the attenuated signal from the output terminal of said attenuator.

3. A variable gain amplifier according to claim 1, wherein
said attenuator includes the passive circuit connected between an input terminal of said attenuator and an output terminal of said attenuator, operates the passive circuit at the virtual ground potential provided from said virtual ground point providing circuit to the output terminal of said attenuator to attenuate the input signal from the input terminal of the variable gain amplifier, and outputs the attenuated signal from the output terminal of said attenuator, and
said virtual ground point providing circuit provides the virtual ground potential to the input terminal of said virtual ground point providing circuit, and amplifies and outputs a signal input from the input terminal of said virtual ground point providing circuit.

4. A variable gain amplifier according to claim 2, wherein said virtual ground point providing circuit includes an operational amplifier having a ground terminal which receives an external ground potential different from the ground node of the variable gain amplifier.

5. A variable gain amplifier according to claim 4, wherein the input terminal of said virtual ground point providing circuit is connected to one of an inverting input terminal and non-inverting input terminal of the operational amplifier.

6. A variable gain amplifier according to claim 1, wherein the isolation active circuit includes one of a field effect transistor having a drain terminal connected to the input terminal of said virtual ground point providing circuit and a gate terminal that receives a fixed bias voltage, and a bipolar transistor having a collector terminal connected to the input terminal of said virtual ground point providing circuit and a base terminal that receives a fixed bias voltage.

7. A variable gain amplifier according to claim 6, wherein said virtual ground point providing circuit includes one of a field effect transistor having a source terminal connected to the input terminal of said virtual ground point providing circuit and a gate terminal that receives a fixed bias voltage, and a bipolar transistor having an emitter terminal connected to the input terminal of said virtual ground point providing circuit and a base terminal that receives a fixed bias voltage.

8. A variable gain amplifier according to claim 3, wherein
the isolation active circuit includes one of a field effect transistor having a drain terminal connected to the input terminal of said virtual ground point providing circuit and a gate terminal that receives a fixed bias voltage, and a bipolar transistor having a collector terminal connected to the input terminal of said virtual ground point providing circuit and a base terminal that receives a fixed bias voltage, and
said virtual ground point providing circuit includes one of a field effect transistor which has a source terminal connected to the input terminal of said virtual ground point providing circuit and a gate terminal that receives a fixed bias voltage, and which amplifies a signal input from the input terminal of said virtual ground point providing circuit and outputs the signal from a drain terminal, and a bipolar transistor which has an emitter terminal connected to the input terminal of said virtual ground point providing circuit and a base terminal that receives a fixed bias voltage, and which amplifies a signal input from the input terminal of said virtual ground point providing circuit and outputs the signal from a collector terminal.

9. A variable gain amplifier according to claim 3, wherein said virtual ground point providing circuit includes a current mirror circuit including the isolation active circuit, and outputs a signal output from the current mirror circuit.

* * * * *